United States Patent
White et al.

(10) Patent No.: US 8,574,411 B2
(45) Date of Patent: Nov. 5, 2013

(54) REACTIVE SPUTTERING CHAMBER WITH GAS DISTRIBUTION TUBES

(75) Inventors: John M. White, Hayward, CA (US); Yan Ye, Saratoga, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/270,058

(22) Filed: Oct. 10, 2011

(65) Prior Publication Data

US 2012/0024693 A1 Feb. 2, 2012

Related U.S. Application Data

(63) Continuation of application No. 11/399,233, filed on Apr. 6, 2006, now abandoned.

(51) Int. Cl.
| C25B 9/00 | (2006.01) |
|---|---|
| C25B 11/00 | (2006.01) |
| C25B 13/00 | (2006.01) |
| C23C 14/00 | (2006.01) |
| C23C 16/00 | (2006.01) |
| C23C 16/50 | (2006.01) |

(52) U.S. Cl.
USPC .............. 204/298.07; 204/298.02; 118/715; 118/723 MP

(58) Field of Classification Search
USPC ............ 204/298.1, 298.07, 298.02; 118/715, 118/723 MP
See application file for complete search history.

(56) References Cited

U.S. PATENT DOCUMENTS

| 4,425,218 A | * | 1/1984 | Robinson .................. 204/298.07 |
| 4,769,291 A | | 9/1988 | Belkind et al. |
| 5,346,601 A | | 9/1994 | Barada et al. |
| 5,352,300 A | | 10/1994 | Niwa et al. |
| 5,514,259 A | | 5/1996 | Shiota et al. |
| 5,522,934 A | | 6/1996 | Suzuki et al. |
| 5,620,523 A | | 4/1997 | Maeda et al. |
| 5,622,606 A | * | 4/1997 | Kugler et al. ............ 204/192.12 |
| 5,668,663 A | | 9/1997 | Varaprasad et al. |
| 5,683,537 A | | 11/1997 | Ishii |
| 5,700,699 A | | 12/1997 | Han et al. |

(Continued)

FOREIGN PATENT DOCUMENTS

| EP | 0858095 A2 | 8/1998 |
| EP | 1746181 A2 | 1/2007 |

(Continued)

OTHER PUBLICATIONS

'Circumference' definition. Merriam-Webster Online Dictionary [http://www.merriam-webster.com/dictionary/circumference] [Accessed on Mar. 4, 2013].*

(Continued)

*Primary Examiner* — Michael Band
(74) *Attorney, Agent, or Firm* — Patterson & Sheridan, LLP

(57) ABSTRACT

A sputtering apparatus for processing large area substrates is provided. By introducing gas across the entire target surface, a uniform composition film may be formed on the substrate. When the gas is introduced merely at the perimeter, the gas distribution is not uniform. By providing a gas introduction tube across the processing area, the reactive gas will uniformly distribute to the whole target. Also, providing the gas tube with multiple inner tubes provides a quick, effective gas dispersion capability.

6 Claims, 7 Drawing Sheets

(56) References Cited

U.S. PATENT DOCUMENTS

| | | | |
|---|---|---|---|
| 5,993,594 | A | 11/1999 | Wicker et al. |
| 6,022,461 | A | 2/2000 | Kobayashi et al. |
| 6,148,764 | A | 11/2000 | Cui et al. |
| 6,200,431 | B1 | 3/2001 | Sone et al. |
| 6,228,236 | B1 | 5/2001 | Rosenstein et al. |
| 6,238,527 | B1 | 5/2001 | Sone et al. |
| 6,329,269 | B1 | 12/2001 | Hamada et al. |
| 6,458,673 | B1 | 10/2002 | Cheung |
| 6,488,824 | B1 | 12/2002 | Hollars et al. |
| 6,787,010 | B2 | 9/2004 | Cuomo et al. |
| 6,881,305 | B2 | 4/2005 | Black et al. |
| 7,235,810 | B1 | 6/2007 | Yamazaki et al. |
| 2003/0049464 | A1 | 3/2003 | Glenn et al. |
| 2003/0207093 | A1 | 11/2003 | Tsuji et al. |
| 2004/0175511 | A1 | 9/2004 | Hartig |
| 2006/0042939 | A1* | 3/2006 | Kim .................. 204/298.23 |
| 2007/0065962 | A1 | 3/2007 | Pichler |

FOREIGN PATENT DOCUMENTS

| | | | |
|---|---|---|---|
| JP | 62042414 | A * | 2/1987 |
| JP | 05243155 | A | 9/1993 |
| JP | 05311425 | A * | 11/1993 |
| JP | 2004323965 | | 11/2004 |
| KR | 1999-009046 | | 3/1999 |
| KR | 2001051193 | | 6/2001 |

OTHER PUBLICATIONS

Machine Translation JP 2004323965.
Notice to File a Response for Korean Patent Application No. 10-2008-7027006 dated Oct. 25, 2010.
Notice of First Office Action for Chinese Patent Application No. 200780011777.6 dated Apr. 14, 2010.
Notification of the Second Office Action for Chinese Patent Application No. 200710128459.X dated Jan. 8, 2010.
PCT International Search Report and Written Opinion dated Oct. 8, 2008 for International Application No. PCT/US2008/071890.
Futsuhara et al. "Optical properties of zinc oxynitride thin films," Thin Solid Films, vol. 317, 1998 Elsevier, pp. 322-325.
International Search Report and Written Opinion dated Aug. 8, 2008 for International Application No. PCT/US08/59638.
Korean Office Action dated Jul. 21, 2008 for Korean Application No. 10-2007-0066962.
Tu et al. "Nitrogen-doped $p$-type ZnO films prepared from nitrogen gas radio-frequency magnetron sputtering," Journal of Applied Physics, vol. 100, Issue 5, 2006 American Institute of Physics, pp. 053705-053705-4.
Zong et al. "Optical band gap of zinc nitride films prepared on quartz substrates from a zinc nitride target by reactive rf magnetron sputtering," Applied Surface Science, vol. 252, Nov. 22, 2006, pp. 7983-7986.
PCT International Search Report and the Written Opinion dated Oct. 15, 2007 for International Application No. PCT/US07/66166.
Office Action for Taiwan Patent Application No. 96112371 dated Jul. 29, 2012.

* cited by examiner

REACTIVE SPUTTERING CHAMBER WITH GAS DISTRIBUTION TUBES

CROSS-REFERENCE TO RELATED APPLICATIONS

This application is a continuation application of U.S. patent application Ser. No. 11/399,233 (APPM/010586), filed on Apr. 6, 2006 now abandoned, which is incorporated herein by reference.

BACKGROUND OF THE INVENTION

1. Field of the Invention

Embodiments of the present invention generally relate to a sputtering apparatus for forming films on large area substrate such as flat panel, large screen televisions, and solar panels.

2. Description of the Related Art

As demand for larger flat panel display screens increases, so must the sputtering target area. As the sputtering target become larger, it becomes increasingly more difficult to adequately provide a uniform distribution of reactive gas to the sputtering target. In the past, reactive gas has been introduced to the sputtering chamber through a gas inlet. The gas inlet is typically located on the side of the chamber. With an increase in target size, the reactive gas tends to not adequately reach the center of the target. When the reactive gas does not uniformly reach the entire target, the film deposited on the substrate will not have a uniform composition across the substrate. For a large area sputtering targets with the gas introduced from the periphery of the target, the gas concentration is highest at the chamber wall where the gas inlet is located. The gas concentration decreases moving across the chamber to a low point in the center of the chamber.

U.S. Pat. No. 5,346,601 to Barada et al. shows a sputtering apparatus in which two gas introduction tubes are provided within a collimator. The gas introduction tubes are perpendicular to each other and within the same plane. The gas tubes extend across the processing area. By providing the gas introduction tubes within the collimator, the reactive gas can adequately be provided to the substrate while not shadowing the wafer from sputtering material. A plurality of gas outlets are present across the tube. In order to remove the gas tubes, the entire collimator structure must be removed. The collimator cannot be removed without also removing the gas tubes.

As shown by Barada et al., sometimes gas introduction tubes can extend across the processing space between the target and the substrate. The gas introduction tubes, such as that used by Barada et al., usually only introduce gas through a series of gas outlet holes formed in a gas introduction tube. A problem with prior art gas introduction tubes is that they must provide the gas at a high pressure through the tube in order to have a uniform pressure passing through the tiny holes in the tube. When the process is stopped and the gas is stopped, gas will continue to flow out of the holes because of the pressure buildup within the tube. The gas will continue to disperse into the processing chamber even after the process has stopped. The excess gas introduced into the chamber may contaminate the wafer or cause further, undesirable reactions with the substrate.

There is a need in the art to provide reactive sputtering gas to a chamber uniformly across a large area sputtering target. There is also a need in the art to provide easily removable reactive gas introduction tubes without disassembling the sputtering chamber.

SUMMARY OF THE INVENTION

The present invention generally involves a sputtering apparatus for forming films on large area substrates such as flat panel, large screen televisions.

In a first embodiment, a sputtering apparatus has a vacuum chamber, a sputtering target, a substrate support, and a plurality of parallel gas introduction tubes. The gas introduction tubes extend across the vacuum chamber in an area between the target and the substrate support.

In a second embodiment, a sputtering apparatus has a vacuum chamber, a sputtering target, a substrate support, and one or more gas introduction tubes extending across the vacuum chamber in an area between the target and the substrate support. Each tube has at least one inner tube having a plurality of openings and an outer tube having a plurality of openings. The outer tube surrounds the at least one inner tube.

In a third embodiment, a method of sputtering a sputtering target in a sputtering apparatus comprises sputtering the target to deposit a layer on a substrate. The apparatus comprises a vacuum chamber, a sputtering target, and a plurality of gas introduction tubes extending across the vacuum chamber in an area between the target and the substrate wherein no collimator is present between the target and the substrate.

In a fourth embodiment, a method of sputtering a sputtering target in a sputtering apparatus is provided that comprises sputtering the target to deposit a layer on the substrate. The sputtering apparatus comprises a vacuum chamber, a sputtering target, and one or more gas introduction tubes extending across the vacuum chamber in an area between the target and the substrate. Each tube comprises at least one inner tube comprising a plurality of openings and an outer tube comprising a plurality of openings. The outer tube surrounds the at least one inner tube.

In a fifth embodiment, a gas introduction tube is disclosed that comprises at least one inner tube comprising a plurality of openings and an outer tube comprising a plurality of openings. The outer tube surrounds the at least one inner tube.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

The present invention generally provides an apparatus to introduce reactive gas to a sputtering target apparatus. The sputtering apparatus can be small enough to process semiconductor wafers or sufficiently large to process large area substrates used in making flat panel television screens.

Figure 2:
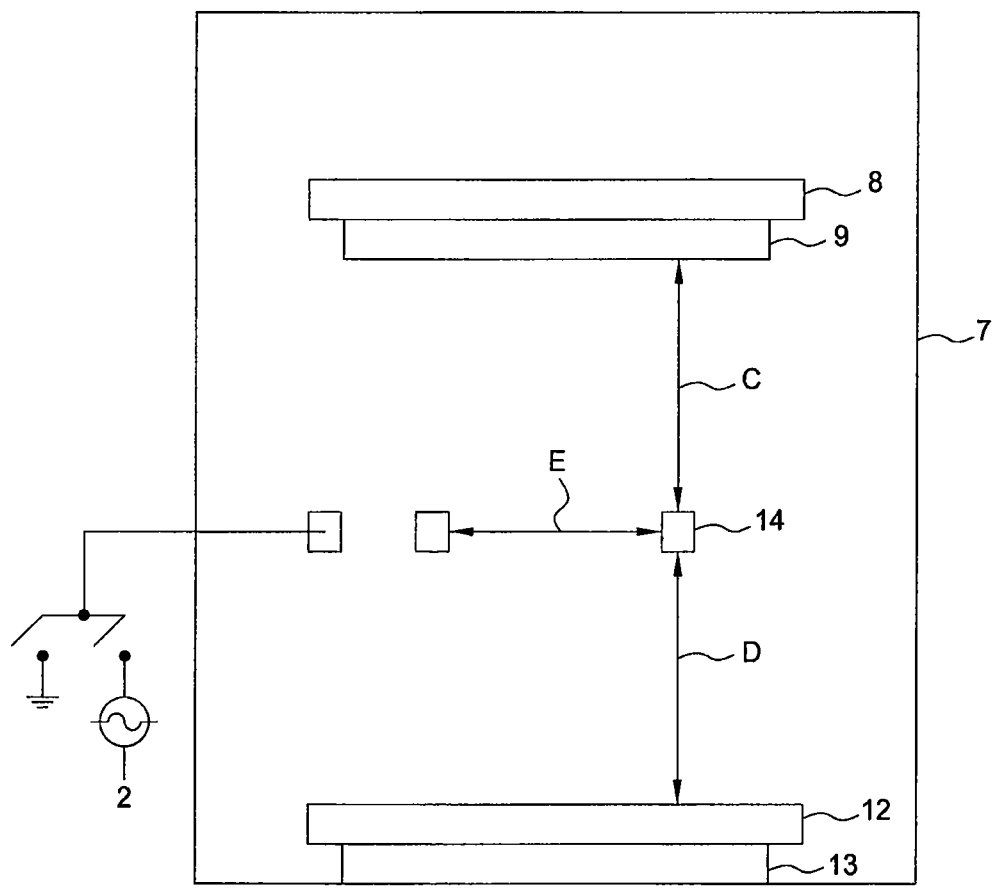
FIG. 2 is a sputtering apparatus according to the instant invention showing the spacing between the target, substrate, and gas introduction tubes.

FIG. 2 is an exemplary schematic of a sputtering apparatus incorporating the instant invention. An exemplary sputtering apparatus which can be modified to incorporate the instant invention is shown in U.S. patent application Ser. No. 11/247, 705 filed Oct. 11, 2005 and hereby incorporated by reference in its entirety. The target 9 rests on a backing plate 8 within a vacuum chamber 7. The substrate 12 is positioned in opposition to the target 9. The substrate 12 rests on a pedestal 13. Between the target 9 and the pedestal 13, gas introductions tubes 14 are found. These tubes 14 extend across the chamber. As few as one and as many as necessary can be provided. If more than one tube 14 is provided, the tubes 14 are substantially parallel to each other and in the same plane as each other. In one embodiment, the gas introduction tubes 14 are spaced about 100 mm to about 300 mm apart. In another embodiment, the gas introduction tubes 14 are spaced about 150 mm to about 180 mm apart as shown by arrow E. The tubes 14 are located about halfway between the target 9 and the substrate 12, but the tubes 14 should be greater than about 30 mm away from the substrate 12 and greater than about 30 mm away from the target 9. If the gas tubes 14 are closer than 30 mm to the target 9, the tubes 14 will likely disturb the plasma by sinking an excessive fraction of electrons from it and form a layer on the target 9. If the gas tubes 14 are closer than 30 mm to the substrate 12, then the gas tubes 14 will block material from evenly reaching the substrate 12 so that a non-uniform film will be formed. The target 9 and substrate 12 can be separated by about 300 mm to about 360 mm. The target 9 would then be about 150 mm to about 180 mm from the tubes 14 as shown by arrow C. The substrate 12 would then be about 150 mm to about 180 mm from the tubes 14 as shown by arrow D.

The gas tubes 14, while located between the target 9 and the substrate 12, are not intended to provide any collimating effect. In fact, it is preferable that the gas tubes 14 do not provide any collimating effect. No collimator should be present. A collimator will interfere with the uniform distribution of material on the substrate 12. Therefore, only as many gas tubes 14 as are necessary to ensure a uniform gas distribution should be present within the chamber. One or more gas tubes 14 could be present. The gas tubes 14 can run in a substantially 2-dimensional plane and could be parallel or substantially parallel. Alternatively, the gas tubes 14 can intersect or even overlap.

By extending the gas introduction tubes 14 across the processing area, the reactive gas can be evenly provided to the target 9 for reaction. When the gas is provided at the periphery, the gas is not evenly distributed to the target 9. When the gas is not evenly distributed, the resulting film will not be uniform in composition across the surface. By providing the reactive gas along the length of the target 9, the reactive gas will be uniformly provided to the target 9 and the deposited film will have a uniform composition across its surface. It is especially difficult to provide reactive gas uniformly to the target 9 when the target 9 is a large area target 9 used for forming flat panel television screens.

As noted above, the prior art gas introduction tubes will still emit gas into the processing region even after the gas has been turned off and the process stopped. The gas continues to flow into the processing region because of the high pressure buildup within the gas introduction tube and the tiny holes through which the gas will pass. Simply increasing the hole size would certainly decrease the pressure and allow the reactive gas to stop flowing upon shutdown, but more gas will leave the tube at the hole closest to the edge than will leave at each additional hole along the gas tube. The larger holes will decrease the pressure and, thus, allow less gas to be introduced at the center of the target 9.

Figure 1:
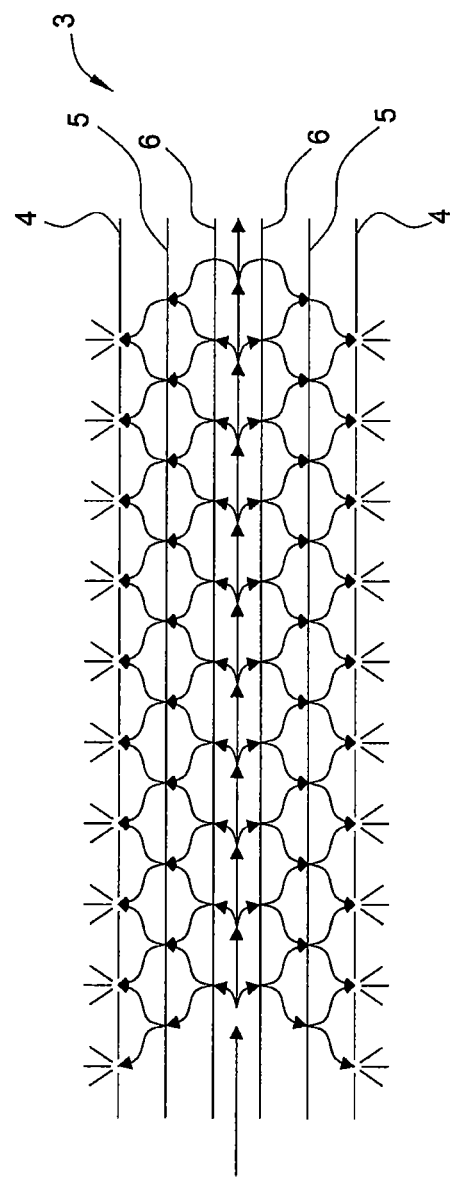
FIG. 1 is a side view of a gas introduction tube used in the instant invention.

Because increasing the hole size will not solve the gas introduction problem, another solution was found to maintain sufficient pressure within the tube to uniformly provide gas to the whole target surface and to also quickly reduce pressure within the tube at shutdown. FIG. 1 shows an exemplary gas introduction tube according to the instant invention. The gas introduction tube 3 contains numerous other tubes within the tube. For clarity, only three tubes are shown in the figure, but it is understood that as many tubes as are practically necessary could be provided. The outer tube has a wall 4 with numerous holes along its length. Within the outer tube is a middle tube that has a wall 5. The middle tube has numerous holes along its length as well. Within the middle tube is an inner tube that has a wall 6 with numerous holes along its length.

The gas introduction tube 3 provides a uniform gas pressure along the length of the tube and quick dispersion of gas at shutdown. Gas flows into the tube 3 through the inner tube at a high pressure. The gas passes through the tube 3 and passes through the wall 6 to the middle tube. The gas in the middle tube is then dispersed through the wall 5 to the outer tube. The gas in the outer tube is then dispersed through wall 4 to the processing chamber. The holes in the walls of the tubes are not lined up. If the holes are lined up, then the gas would disperse directly from the inner tube to the chamber. Such a situation would render the tube 3 exactly the same as the tube of the prior art in effectiveness. By misaligning the holes, the gas must snake through the processing tubes and decrease in pressure as it passes through the holes. By providing the gas in the inner tube at a high pressure, the gas will snake through the middle tube and outer tube until it reaches the processing chamber. Each time the gas passes through a hole to another tube, the pressure will drop. When the gas is turned off, the pressure will rapidly drop within the tube and prevent unwanted gas introduction.

Figure 3A:
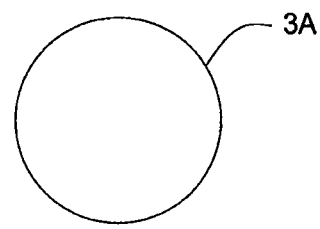
FIGS. 3A-3D are cross sectional representations of gas introductions tubes.
Figure 3B:
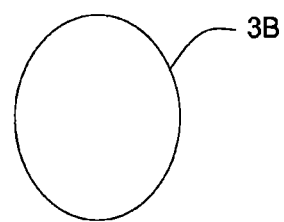
Figure 3C:
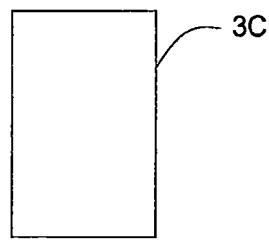
Figure 3D:
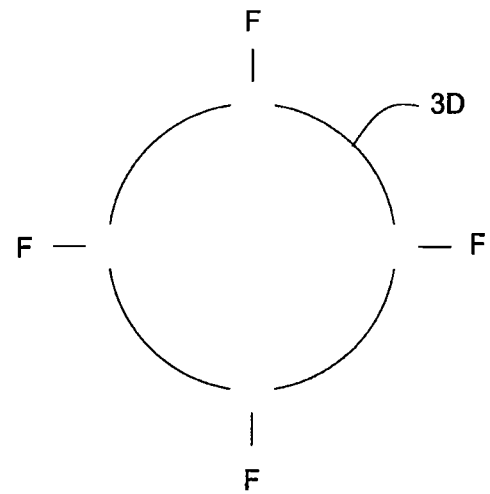

FIGS. 3A-3D show cross sections of gas tubes 3A-3D. The gas tubes 3A-3D can be round (FIG. 3A), oval (FIG. 3B), square (FIG. 3C) or any conventional shape. So long as the shape of the tubes does not interfere with sputtering target material, the shape of the gas introduction tubes is not restricted. FIG. 3D shows a circular gas instruction tube 3D that has a plurality of holes F. The holes F are the outlets for the gas to pass into the chamber. The holes F can face downward towards the substrate, upwards toward the target, or sideways away from both the target and the substrate. In one embodiment, the holes F face away from the target and the substrate. The holes F should be present on less than about 10% of the gas introduction tube 3D. In one embodiment, about 10 to about 50 holes F can span the length of the tube. In another embodiment, about 25 to about 35 holes F can span the length of the tube. The size of the holes F should be much smaller than the diameter of the tubes. In one embodiment, the holes F are about 5 times smaller than the diameter of the tube. In another embodiment, the holes F are about 10 times smaller than the diameter of the tube. The diameter of the tubes can be about 1/8" to about 7/8". In another embodiment, the diameter of the tubes can be about 1/4" to about 3/4".

The gas introduction tubes 14 can have a bias applied to them. The bias can be applied to an individual tube 14 or collectively to all tubes 14. The tubes 14 can have an RF bias applied so that the gas introduction tubes 14 will function not only as a gas source, but also as an ionization source. The gas tubes 14 could also have an AC, DC, or pulsed bias applied from a power source 2 or the tubes 14 can be grounded (see FIG. 2). The gas introduction tubes could be used as an additional sputtering target if desired. The gas tubes should be made of the same material as the sputtering target to prevent contamination.

The gas introduction tubes 14 can also be tailored to suit the needs of the user. For example, multiple tubes 14 can be used with each tube 14 providing a different processing gas. Additionally, the instant invention provides the added benefit of functionality. The tubes 14 can be easily removed through the access port. By removing the tubes 14 through the access ports, the entire chamber does not need to be disassembled to simply change a few tubes 14. Benefits of such an easy removal are clear. Downtime is significantly reduced.

Figure 4:
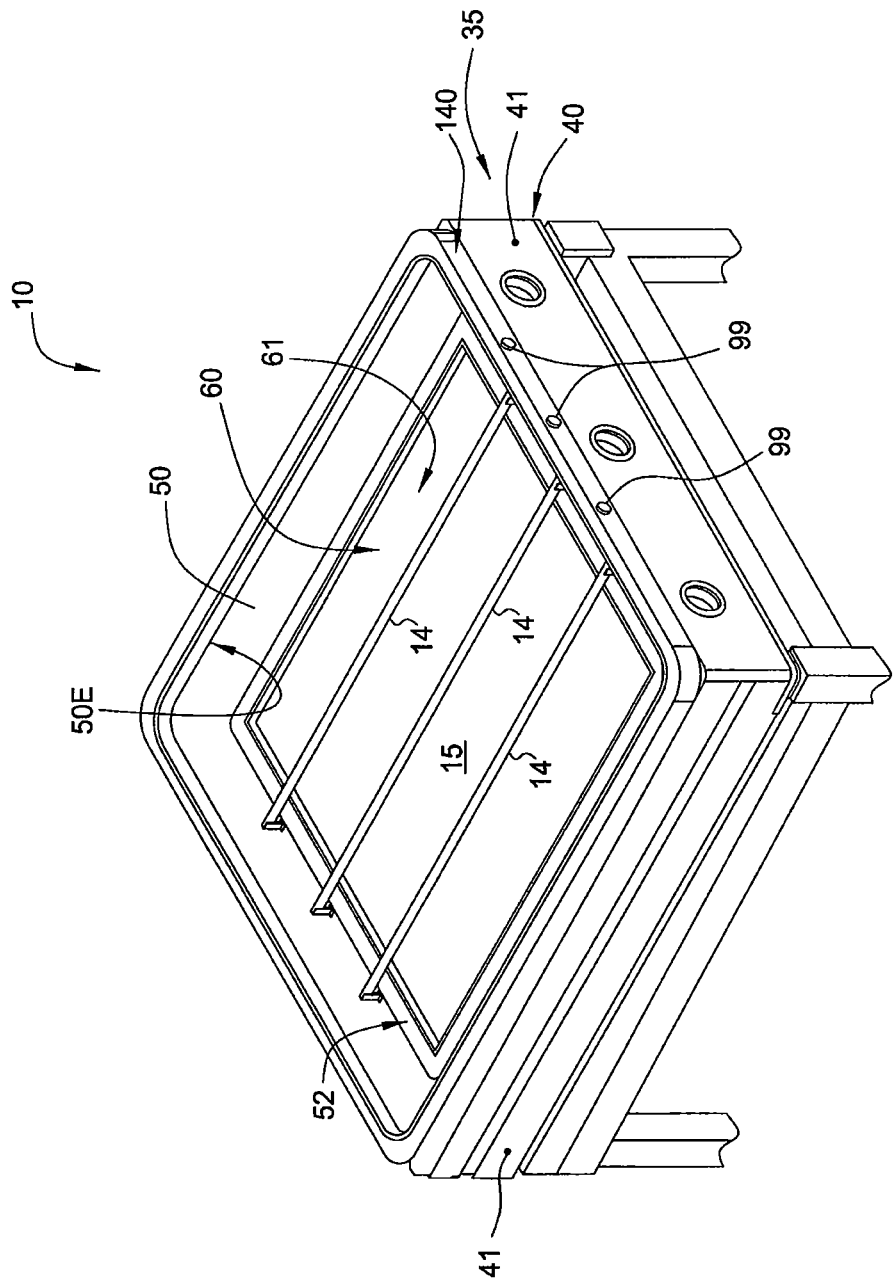
FIG. 4 is an isometric view of a lower chamber assembly in an exemplary physical vapor deposition chamber.
Figure 6:
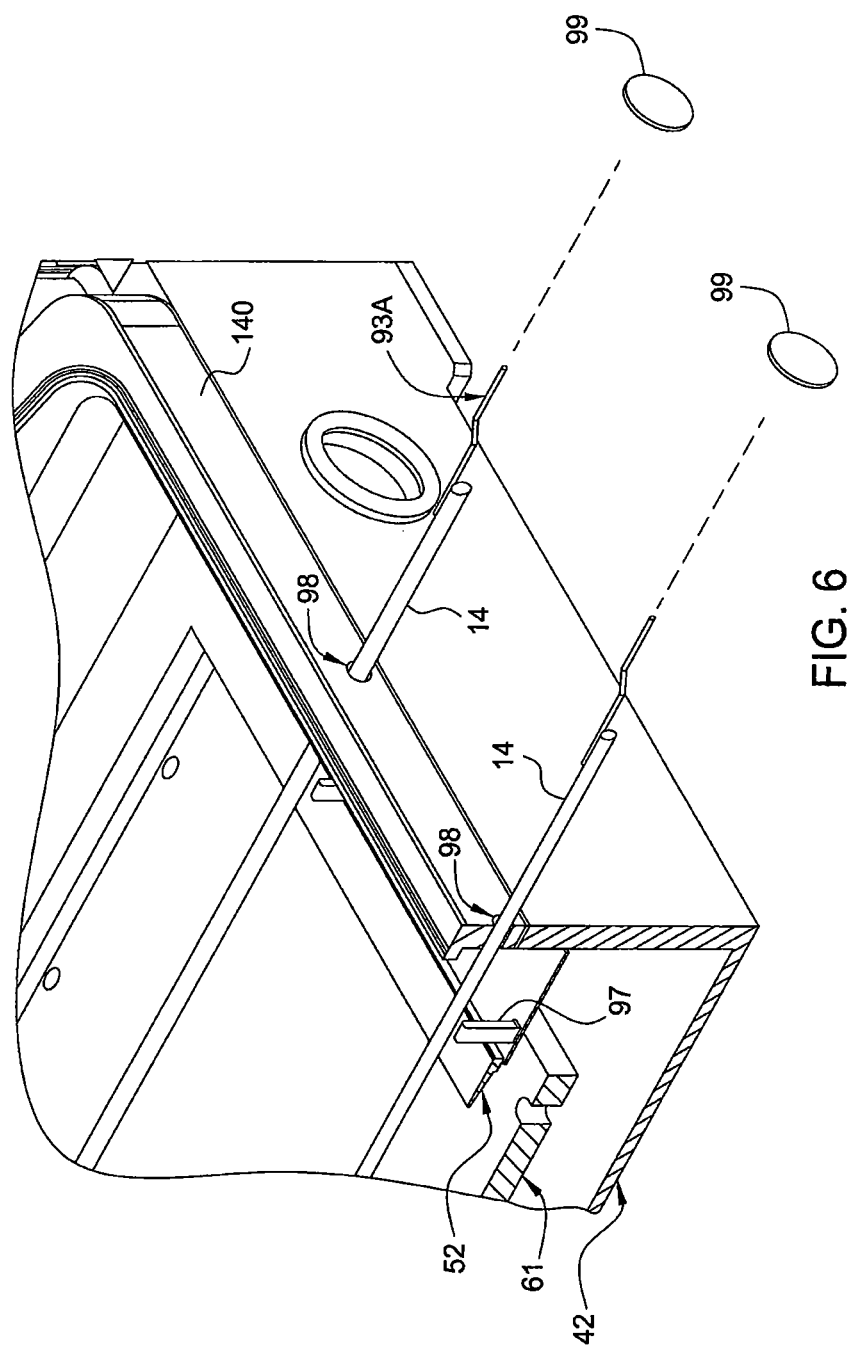
FIG. 6 is an isometric cross-sectional view of a lower chamber assembly in an exemplary physical vapor deposition chamber according to this invention.

In one embodiment of the process chamber 10, illustrated in FIG. 4, the lower chamber assembly 35 may contain one or more gas introduction tubes 14. In one embodiment, each tube 14 extends through the processing region 15. In this configuration the tubes 14 are in electrical contact with the grounded shield 50, so that current flowing through the tubes 14 passes through the shield 50 to ground. In another configuration, the tubes 14 are biased and not in contact with the shield 50. In one embodiment, the tubes 14 are positioned over the stationary conductive member support 97 and is used to hide or isolate the conductive member support 97 from the plasma generated in the processing region 15 (FIG. 6). The ability to hide or isolate the conductive member 97 from the plasma will reduce the amount of deposition that will land on the stationary conductive member support 97 and thus minimize particle generation as the tubes 14 are removed from processing region 15 of the process chamber 10. In one embodiment, the tubes 14 are longer than the target surface in the dimension in the direction in which the tubes 14 extend and thus the conductive member support(s) 97 are not positioned below the target surface so as to limit the interaction between the plasma generated in the processing region 15 and the conductive member support(s) 97.

In FIG. 4 the lid assembly has been removed, and is not shown, to more clearly illustrate some of the components in the lower processing chamber assembly 35. In the embodiment shown in FIG. 4, the lower chamber assembly 35 generally contains a substrate support assembly 60, chamber body assembly 40, a gas delivery system 14 and a shadow frame 52. In one aspect, as shown in FIG. 4 the chamber body assembly 40 generally contains a process kit holder 140, one or more chamber walls 41 and a chamber base 42. The process kit holder 140 is positioned on the chamber walls 41 and is adapted to support the shield 50, an upper shield 50E and one or more tubes 14 (e.g., three shown in FIG. 4). In one aspect, the process kit holder 140 electrically connects the shield 50 and the upper shield 50E to the chamber walls 41 which are grounded. The shield 50 and upper shield 50E are generally sized and adapted to prevent the plasma and sputtered target material from escaping from the process region 15 and depositing on the components in the lower chamber assembly 35. In the configuration illustrated in FIG. 4 the lower chamber assembly 35 contains three tubes 14 that are positioned above the substrate support 61. In one aspect, as shown in FIG. 4, the conductive member support 97 is mounted on and electrically connected to the grounded shield 50.

It should be noted that the cross-sectional area and the material used to form the components in the tube 14, the conductive member 93, and the conductive member support 97 is important since it will affect the ability to withstand the high temperatures that it will be seen during processing (e.g., resistive heating and interaction with the plasma). The number of tubes 14 and the surface area of the conductive member 93 exposed in the processing region 15 is important since it will have an effect amount of current carried by each conductive member 93 and thus the maximum temperature achieved by each conductive member 93 and conductive member support 97 during processing. The total surface area of the conductive member 93 can be defined by the length of the conductive member 93 in the processing region times the length of the exposed perimeter of the conductive member 93 times the number of conductive members positioned in the processing region. In one aspect, the number of gas tubes 14 positioned in the processing region 15 may be between about one and about twenty depending on the desired process uniformity, cost and complexity allowed for a desired application. Preferably, the number of gas tubes 14 that pass through the processing region 15 is as few as possible with a preferred range of between about two and about ten. The exposed perimeter of the embodiment of the conductive member 93 illustrated in FIG. 7 can generally be defined as twice the vertical length plus the horizontal length of surface of the conductive member 93. In one example, for a substrate that is 1800 mm×1500 mm in size the exposed surface area of all of the conductive members 93 was about 5.0 m$^2$, which is spread across seven conductive members 93 that were 1.9 meters long. In one aspect, the cross-sectional area of the conductive member 93 is sized to carry the current delivered to the conductive members 93 from the plasma generated by the target bias. In one example, the total current that could be carried by all of the conductive members is about 1000 amps.

While FIGS. 4-7 illustrate embodiments of the tubes 14 that are generally straight and are generally rod or bar shaped, this configuration is not intended to limit the scope of the invention described herein. In general, the term bar, or rod, shaped as used herein is intended to described a component that is longer (e.g., X-direction) than its cross-section is wide or high. In one aspect, the bar or rod shaped tubes 14 are not straight and thus have one or more regions along their length that are curved or coiled. In one embodiment, the tubes 14 are positioned throughout the processing region to improve the sputter deposited film uniformity on the substrate surface by increasing the tube surface area and not appreciably obstructing or altering the amount and/or direction of the flux of sputtered material passing from the target to the substrate surface. Referring to FIGS. 3A-3D, in one embodiment, the cross-section of the tubes 14 are oval, round, rectangular, or other cross-sectional shape that will not appreciably obstruct or alter the amount and/or direction of the flux of sputtered material passing from the target to the substrate surface.

Figure 5:
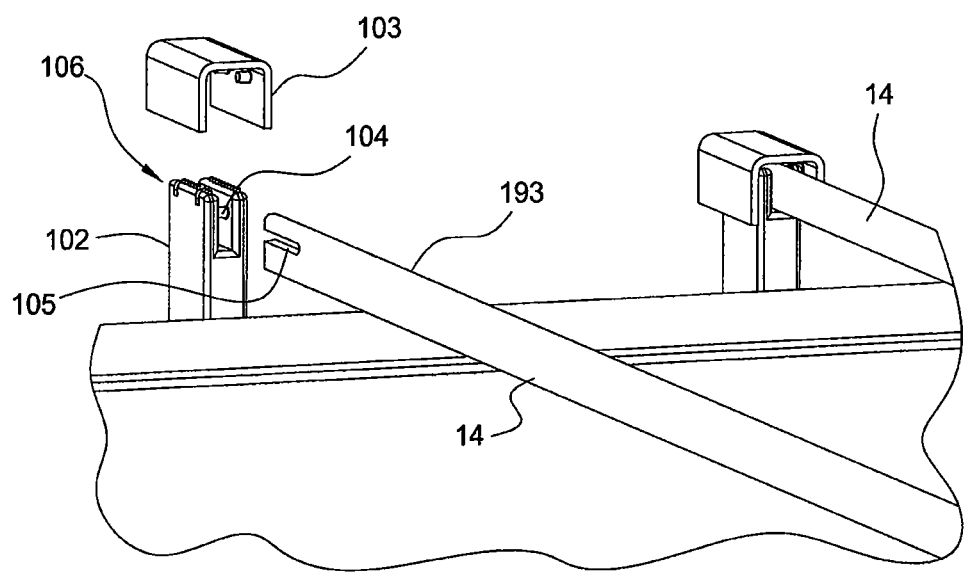
FIG. 5 is an isometric cross-sectional view of gas introduction tubes formed in an exemplary physical vapor deposition chamber.

FIG. 5 illustrates an exploded isometric view of a tube 14 that has a conductive member electrical connection point 105 that is adapted to electrically contact a support electrical connection point 104 of the support 102. In one aspect, the conductive member electrical connection point 105 and the support electrical connection point 104 act as a pivot point 106 that allows the tube 14 to be positioned in and/or removed from the processing region 15 (discussed below). To hide the pivot point 106 a support cover 103 is positioned over this region to prevent the sputtered material deposition from inhibiting the removal of these components from the process region 15. The conductive member support 97 may have a pivot point 106 at one end and an end that is detachable from the other vertical support.

In one embodiment, not shown, the tubes 14 are cantilevered over the substrate surface and thus do not extend all the way across the substrate. In one aspect, the cantilevered end of the tubes 14 may only extend to a point that is above the center of the substrate positioned on the substrate support. In one aspect, the cantilevered tubes 14 are evenly distributed throughout the processing region 15.

While the embodiments of the process chamber 10 illustrated herein all show the tubes 14 in contact with the shield 50, this configuration is not intended to be limiting to the scope of the invention described herein. Therefore, in some embodiments the vertical support may be mounted on a bracket or supporting surface positioned in the chamber body assembly 40.

Gas Tube Removal

FIG. 6 is an isometric cross-sectional exploded view as viewed from outside the process chamber 10 that illustrates the tubes 14 and plates 99 in a position that is partially removed from the processing region 15 of the process chamber 10. In one embodiment of the invention, the tubes 14 are adapted to be removed from the process chamber 10 through an access port 98 formed in the process kit holder 140. In one aspect, the access port 98 may be formed in the chamber wall 41. In FIG. 6, the lid assembly has been removed to more clearly illustrate some of the components in the lower processing chamber assembly 35. The tube 14 has a handle 93A that is attached or welded to the surface of the gas introduction tubes 14 to facilitate the insertion and/or removal of the gas introduction tubes 14 through the access port 98 formed in the process kit holder 140.

When the tube 14 has reached its useable lifetime, the tube 14 can be removed from the processing region 15 by venting the process chamber 10 and removing a plate 99 that is sealably attached to the process kit holder 140 so that a user can access the tube 14 through the access port 98. The process of removing the tube 14 may include shutting "off" the vacuum pumps (not shown) and then delivering a flow of an inert gas, such as argon, into the vacuum processing area from the tubes 14 to create a pressure greater than atmospheric pressure in the vacuum processing area. Creating a positive pressure in the processing area during the removal of the tube 14 may be advantageous since it can prevent the contamination of the chamber components positioned in the processing region 15 due to the exposure of the process kit components to atmospheric contamination (e.g., atmospheric gases, vapors or particles). In one aspect, the access ports 98 are purposely kept as small as possible to minimize the area through which atmospheric contamination can enter the processing region 15. The down time of the processing chamber 10 can thus be minimized since there is no need to remove and reposition the chamber lid assembly 20 and/or other major chamber components, there is no need to bake out of the chamber to remove adsorbed gases and water from processing chamber components, and there is no need to replace contaminated components due to their exposure to atmospheric contamination.

Gas Introduction Tube Bias

Figure 7:
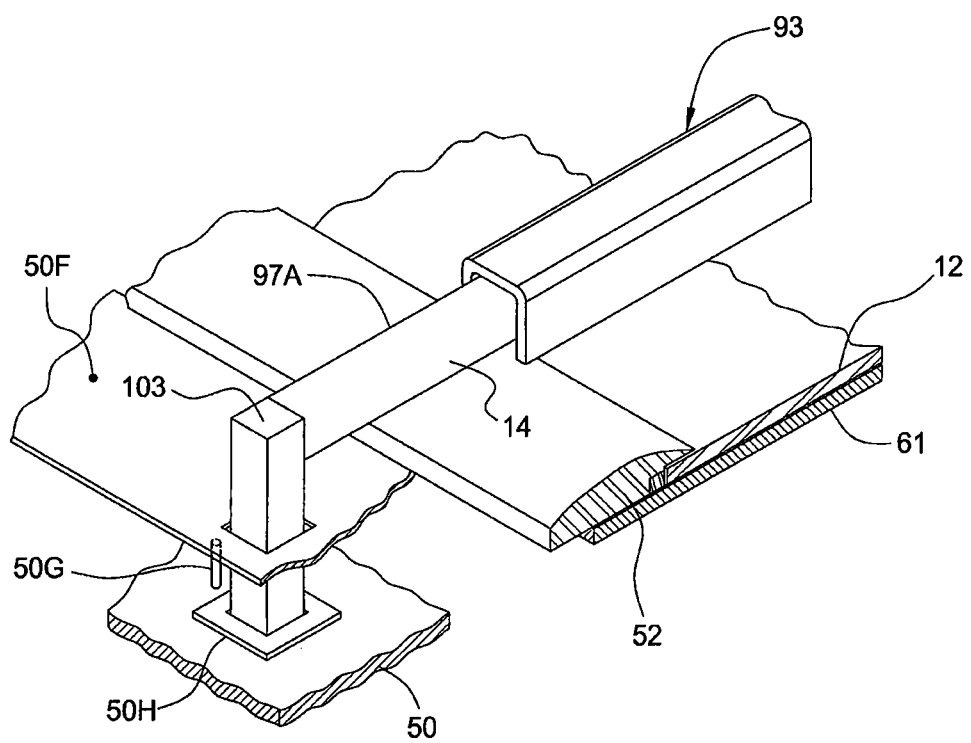
FIG. 7 is an isometric cross-sectional view of gas introduction tubes formed in an exemplary physical vapor deposition chamber according to this invention.

In one embodiment of the process chamber 10, a biasable shield 50F may be positioned in the processing region to change the electric field and the plasma density generated near the edge of the target and substrate. FIG. 7 illustrates one embodiment of the biasable shield 50F that is positioned around the periphery of the substrate 12 and is electrically connected to the shield 50, which is grounded, by use of an electrical component 50G. In one aspect, the electrical component 50G may be used as a "stand-off" to physically space the biasable shield 50F from the shield 50. It should be noted that the term "grounded" is generally intended to describe a direct or in-direct electrical connection between a component and the anode. The biasable shield 50F may be purposely biased at a different potential versus the tube surfaces due to the introduction of the electrical component 50G that may add resistive, capacitive and/or inductive type elements to the electrical path between the biasable shield 50F and the tube surfaces. In one aspect, during processing a bias voltage, which will generally be less anodic, may be "passively" induced in the biasable shield 50F due to a bias applied between the target and anodic surface (e.g., shield 50) and the interaction of the biasable shield 50F with the plasma generated in the processing region. In another aspect, not shown, the biasable shield 50F may be separately biased by use of a power supply (not shown) which is in electrical communication with the biasable shield 50F and the anode surfaces. In this configuration the electrical component 50G may act as an insulator.

In another embodiment of the processing chamber 10, the tubes 14 may be purposely biased at a different potential versus the anode surfaces by the introduction of a resistive, capacitive and/or inductive components to the electrical path between the tubes 14 and the anode surfaces. In one embodiment, as shown in FIG. 7, a second electrical component 50H may be positioned in the electrical path between the tube 14 and the shield 50 to allow the tube 14 to be biased at a different potential than the shield 50. In one aspect, during processing a bias voltage, which will generally be less anodic, may be "passively" induced in the tube 14 due to a bias applied between the target and anodic surface (e.g., shield 50) and the interaction of the tube 14 with the plasma generated in the processing region. In another aspect, the tube 14 may be separately biased by use of a power supply (see FIG. 2) which is in electrical communication with the tubes 14. In this configuration the second electrical component 50H may act as an insulator.

While the foregoing is directed to embodiments of the present invention, other and further embodiments of the invention may be devised without departing from the basic scope thereof, and the scope thereof is determined by the claims that follow.

The invention claimed is:

1. A Plasma Vapor Deposition apparatus for depositing a layer on a substrate, comprising:
   a vacuum chamber;
   a substrate support positioned in the vacuum chamber; and
   a plurality of gas introduction tubes extending across an internal volume of the vacuum chamber, the gas introduction tubes comprising:
   a first inner tube having a plurality of first openings extending along a first center axis, the first openings occupying a first plurality of different angular positions on a circumference of the first inner tube, wherein the first plurality of different angular positions are defined with respect to the first center axis that extends along a flow direction of the first inner tube;
   an outer tube surrounding the first inner tube and having a plurality of second openings extending along the first center axis which do not align with the first openings, the second openings occupying a second plurality of different angular positions on a circumference of the outer tube, wherein the second plurality of different angular positions are defined with respect to the first center axis; and a second inner tube having a plurality of third openings extending along the first center axis which do not align with the first openings, the first inner tube surrounding the second inner tube.

2. The apparatus of claim 1, wherein the first openings are about 5 to 10 times smaller than a diameter of the outer tube.

3. The apparatus of claim 1, wherein the second openings are about 5 to 10 times smaller than a diameter of the first inner tube.

4. The apparatus of claim 1, wherein the first openings occupy four different angular positions on the circumference of the first inner tube.

5. The apparatus of claim 1, wherein the second openings occupy four different angular positions on the circumference of the outer tube.

6. A Plasma Vapor Deposition apparatus for depositing a layer on a substrate, comprising:

a vacuum chamber;

a substrate support positioned in the vacuum chamber; and a plurality of gas introduction tubes extending across an internal volume of the vacuum chamber, the gas introduction tubes comprising:

a first inner tube having a plurality of first openings extending along a first center axis, the first openings occupying four different angular positions on a circumference of the first inner tube, wherein the first angular positions are defined with respect to the first center axis that extends along a flow direction of the first inner tube;

an outer tube surrounding the first inner tube and having a plurality of second openings extending along the first center axis which do not align with the first openings, the second openings occupying four different angular positions on a circumference of the outer tube, wherein the second plurality of different angular positions are defined with respect to the first center axis; and a second inner tube having a plurality of third openings extending along the first center axis which do not align with the first openings, the first inner tube surrounding the second inner tube.

\* \* \* \* \*